(12) United States Patent
Shigaki et al.

(10) Patent No.: US 7,729,129 B2
(45) Date of Patent: Jun. 1, 2010

(54) MOUNTING DEVICE FOR HIGH FREQUENCY MICROWAVE DEVICES

(75) Inventors: Masafumi Shigaki, Kawasaki (JP); Isao Nakazawa, Kawasaki (JP); Kazunori Yamanaka, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 92 days.

(21) Appl. No.: 11/873,445

(22) Filed: Oct. 17, 2007

(65) Prior Publication Data

US 2008/0144287 A1  Jun. 19, 2008

Related U.S. Application Data

(60) Division of application No. 10/930,350, filed on Aug. 27, 2004, now Pat. No. 7,285,429, and a continuation of application No. PCT/JP02/11753, filed on Nov. 12, 2002.

(51) Int. Cl.
*H05K 9/00* (2006.01)

(52) U.S. Cl. .................... 361/814; 361/760; 333/247; 438/15; 438/121

(58) Field of Classification Search ............. 361/760, 361/814, 808; 174/520; 333/247; 438/15, 438/121
See application file for complete search history.

(56) References Cited

U.S. PATENT DOCUMENTS

| | | | | |
|---|---|---|---|---|
| 3,803,459 | A | * | 4/1974 | Matisoo ................ 257/32 |
| 3,982,271 | A | | 9/1976 | Olivieri et al. |
| 4,178,602 | A | * | 12/1979 | Kandyba et al. ......... 257/34 |
| 4,471,837 | A | | 9/1984 | Larson |
| 5,348,305 | A | * | 9/1994 | Lowe ................ 473/133 |
| 5,550,389 | A | * | 8/1996 | Nishino et al. ........... 257/30 |
| 5,898,909 | A | * | 4/1999 | Yoshihara et al. ......... 455/73 |
| 5,901,039 | A | | 5/1999 | Dehaine et al. |
| 5,917,388 | A | * | 6/1999 | Tronche et al. .......... 333/246 |
| 5,977,479 | A | * | 11/1999 | Tokuda et al. .......... 174/15.4 |
| 6,075,701 | A | | 6/2000 | Ali et al. |
| 6,108,214 | A | * | 8/2000 | Fuse ................. 361/818 |

(Continued)

FOREIGN PATENT DOCUMENTS

EP   0840443   5/1998

(Continued)

OTHER PUBLICATIONS

Supplementary Partial European Search Report dated Jul. 18, 2007, from the corresponding European Application.

(Continued)

*Primary Examiner*—Dameon E Levi
(74) *Attorney, Agent, or Firm*—Katten Muchin Rosenman LLP

(57) ABSTRACT

In a package mounting structure for mounting a package on a case, wherein the package internally incorporates at least one of a high-frequency transistor, MIC and MMIC used in the microwave to millimeter-wave band, and a base thereof is formed of metal and serves as ground, an electrically conductive sheet having excellent thermal conductivity and exhibiting restorability and having a size identical with that of the base of the package is laid on the case at a package-bearing location, the package and sheet are fastened together by two or more screws, and the sheet is mounted on the case while it is pressed by a pressing force of 10 N/cm$^2$ or greater owing to fastening.

1 Claim, 15 Drawing Sheets

U.S. PATENT DOCUMENTS

| | | |
|---|---|---|
| 6,222,741 B1 | 4/2001 | Drennen et al. |
| 6,223,815 B1 | 5/2001 | Shibasaki |
| 6,249,439 B1 * | 6/2001 | DeMore et al. ............. 361/752 |
| 6,323,426 B1 | 11/2001 | Hoshizaki et al. |
| 6,462,960 B1 * | 10/2002 | Watanabe ................... 361/816 |
| 6,507,495 B1 * | 1/2003 | Hailey et al. ................ 361/748 |
| 6,661,317 B2 * | 12/2003 | Ali et al. ..................... 333/247 |
| 7,436,679 B2 * | 10/2008 | Iijima et al. ................. 361/760 |
| 2004/0036162 A1 | 2/2004 | Chuang et al. |
| 2004/0232447 A1 | 11/2004 | Crane et al. |
| 2006/0108672 A1 | 5/2006 | Brennan et al. |

FOREIGN PATENT DOCUMENTS

| | | | |
|---|---|---|---|
| FR | 2630261 | | 10/1989 |
| JP | 57177544 | | 11/1982 |
| JP | 62-193269 | | 8/1987 |
| JP | 575283 | | 3/1993 |
| JP | 05055419 | | 3/1993 |
| JP | 0823183 | | 1/1996 |
| JP | 0992955 | | 4/1997 |
| JP | 992955 | | 4/1997 |
| JP | 10283650 | | 10/1998 |
| JP | 10-322066 | | 12/1998 |
| JP | 10322066 | | 12/1998 |
| JP | 11110084 | | 4/1999 |
| JP | 11-204844 | | 7/1999 |
| JP | 11250032 | | 9/1999 |
| JP | 2000-169125 | | 6/2000 |
| JP | 2000165077 | | 6/2000 |
| JP | 2000232284 | | 8/2000 |
| JP | 20002236629 | | 8/2000 |
| JP | 2000-269671 | | 9/2000 |
| JP | 2000338605 | | 12/2000 |
| JP | 2002-202729 | | 7/2002 |
| JP | 2004228543 | * | 8/2004 |

OTHER PUBLICATIONS

Norm Dye, et al., "Using FR Transistors Power Construction Techniques" Electronics World, Nexus Media Communications, vol. 100, No. 1696, Mar. 1, 1994, pp. 218-223.

Supplementary European Search Report dated Nov. 7, 2007, from the corresponding European Application.

Notification of Reason(s) for Refusal dated Aug. 12, 2008, from the corresponding Japanese Application.

European Search Report dated Jan. 15, 2010, from the corresponding European Application.

* cited by examiner

AA—AA'

BB—BB'

MOUNTING DEVICE FOR HIGH FREQUENCY MICROWAVE DEVICES

BACKGROUND OF THE INVENTION

This invention relates to a mounting structure of a package, which incorporates at least one of a high-frequency transformer, MIC (Microwave Integrated Circuit) and MMIC (Monolithic Microwave Integrated Circuit) used in the microwave to millimeter-wave band, or of a superconducting circuit board. More particularly, the invention relates to a mounting structure whereby a thermally excellent state can be obtained without sacrificing the microwave characteristic.

Any of the following methods has been implemented heretofore in order to mount a microwave circuit, which handles signals in the microwave to millimeter-wave band, on a case (heat sink): ① the circuit is mounted upon interposing a soft metal such as indium between the case and the package or board; ② the circuit is mounted upon applying a silicon compound or grease between the case and the package or board; ③ the circuit is mounted directly without doing any of these; and ④ the circuit is mounted on the case directly by soldering.

Further, in the case of a low-frequency circuit, use has been made of the fact that a graphite sheet exhibits thermal anisotropy, wherein the heat that evolves from the heated portion of the low-frequency circuit is transported to a remote location by the graphite sheet so that the heat is dissipated. A further method that has been employed similarly makes use of the properties of a graphite sheet, interposes the graphite sheet between the heat-producing portion of the package and the case and applies pressure to the package as by auxiliary hardware to allow heat to escape. However, these expedients are applied to low-frequency circuits and are not implemented in the case of microwave circuits.

Graphite is an allotrope of carbon and in one sense is akin to diamond but in another is merely the lead of a pencil. A graphite sheet is obtained by molding graphite, which is close to diamond that has an attractive crystal alignment, into sheet form and exhibits a high thermal conductivity second to that of diamond. The thermal conductivity of copper or aluminum is less than one-half that of graphite in one direction. For these reasons, a graphite sheet is ideal as a heat transfer material. However, since a graphite sheet is not in liquid form as in the manner of grease, making it adhere perfectly is a difficult challenge.

Problems of Mounting Structures for Microwave and Millimeter-Wave Circuits

In the usual mounting structure of a microwave and millimeter-wave band circuit, a package internally incorporating a transistor, MIC or MMIC that evolves a high degree of heat is mounted on a metal case and a circuit board on which microstrips have been patterned is disposed about the package. In order to facilitate the dissipation of heat produced by the package, the area of contact between the package and the case has its surface roughness removed to improve planarity and provide as much surface contact as possible.

In the microwave and millimeter-wave band, however, it is required that the lower part of the package be grounded in its entirety. No matter how much surface roughness and planarity are improved, contact is point contact in micro terms. In particular, if the package bends due to heat, ground will not be stable and good electrical characteristics (microwave characteristics) will not be obtained. Further, the heat-dissipating effect is limited, the package warps owing to evolution of heat and contact worsens, thus further destabilizing ground. Though warp preventing screws or the like below the heat-producing body can help, the only method available is to screw down the periphery of the package from above. Even if grounding is achieved, the temperature of the semiconductor may exceed the absolute maximum rating if power consumption is high when one takes thermal resistance into account.

A method of securing the package to the case (heat sink) by solder is available as a method of solving the above-mentioned problem. If the package is secured by soldering, however, it cannot be moved again. If a malfunction or the like occurs, therefore, it is necessary to replace the case in its entirety and not just the package in which the transistor, MIC or MMIC is mounted. This means that all of the circuits included in the case must be replaced. The problem that arises is an increase in cost.

Further, there is a method that uses a silicon compound as a material that may be replaced subsequently. However, since the compound is an insulator, a problem encountered is that grounding is difficult to achieve. In addition, the technique for applying the compound thinly and skillfully is difficult. This is a task requiring skill.

A method of laying an indium sheet is available as a method of achieving ground. However, the sheet is squashed by pressure from above and has no resiliency. If it is used for a long period of time, therefore, a gap may form between the package and the case. This gives rise to reliability-related problems and a change in electrical characteristics.

Further, in the case of a low-frequency circuit, sandwiching a graphite sheet between the heat-producing portion and the case has been considered. A structure of the kind illustrated in the sectional view of FIG. 20 has been proposed. Specifically, a cap filter 3 is interposed in a gap between a heat source (MPU, PA, graphic chip, etc.) 2 provided in a package 1 and the upper part of the package, a graphite sheet 4 is laid on the top surface of the package and a case (heat sink) is laid on the graphite sheet and fixed, thereby achieving mounting. If this expedient is adopted, heat is transferred in the directions indicated by the arrows. If the graphite sheet 4 is used, a non-uniform heat distribution HTD1 that prevails when the graphite sheet is not used changes to a heat distribution HTD2 owing to dissipation of heat through the entirety of the heat sink and the heat at the heat-producing portion is dissipated. FIG. 21 is a diagram for describing a DVD-RAM mounting structure. A pick-up 8 is provided below a printed board 7 on which CPUs 6a, 6b are mounted, and a PGS graphite sheet 4 is placed on a heat-producing portion such as a light-emitting diode of the pick-up 8. In the arrangement of FIG. 21, heat evolved by the CPUs and pick-up is transferred to and dissipated from an external case 9 via the graphite sheet 4.

However, it is difficult to apply the mounting structures of FIGS. 20 and 21 to mounting of a microwave circuit. The reason is that in the case of a microwave circuit, it is necessary to place a circuit board, the principle part of which is a microstrip, in a surrounding area in close proximity to the package (transistor, MIC or MMIC).

In the case of a low-frequency circuit, as shown in FIG. 21, no problems arise even if connection is by point contact. However, in the case of a package internally accommodating a microwave circuit, a surface-contact ground structure becomes necessary. In the mounting arrangements of FIGS. 20 and 21, the graphite sheet exhibits superior heat transfer in the transverse direction, as indicated by the arrows. However, since a single sheet is thin, there is little spread of heat in the transverse direction, as indicated by these drawings.

Further, the structure in FIG. 20 is such that in order to press the heat-producing portion against the graphite sheet 4, it is held down from above by the case 5. In this case, the space above the surrounding circuit also is narrowed. In the case of a microwave circuit, the space above the peripheral circuitry is reduced. As a result, even if peripheral circuitry is installed, ground above the circuit is too close and it is difficult to obtain the usual microwave characteristics. Further, in order to dissipate heat in practical terms, special hardware for strong hold-down is required.

Though the attaching method of the case is not clarified in FIG. 21, fixing the CPU package to the heat dissipating portion (the external case) by the graphite sheet 4, which is an adhesive layer, is contemplated. However, the existence of an adhesive layer enlarges thermal resistance. Further, the lower part of the package of the transistor, MIC or MMIC used in a microwave and millimeter-wave band power circuit, which evolves a large amount of heat, is greater than 100° C. Since an adhesive layer can withstand a high temperature only on the order of 100° C., the sheet constituting the adhesive layer cannot be used in mounting a microwave circuit in the manner of the mounting structure of FIG. 21. Further, since the mounting structure of FIG. 21 is for dealing with a low-frequency circuit, the special nature of microwave and millimeter-wave high-frequency circuits is not taken into consideration and there are limitations with regard to the mounting of a microwave circuit that requires the placement of a board, the principle part of which is a microstrip, in a surrounding area in close proximity to the package (transistor, MIC or MMIC).

In FIG. 22, a diagram in which pressure is applied to the package 1 is drawn in order to measure thermal resistance, and the entirety of the package 1 is subjected to pressure. This also is a structure in which the package is pressed from above. Problems the same as those of FIGS. 20 and 21 occur. That is, with a structure in which the entirety of the package of FIG. 22 is pressed down from above, the space above the surrounding circuitry takes on the same height as that of the package. In the case of a microwave circuit, the space above the circuit diminishes. As a result, even if circuitry is installed, ground above the circuit is too close and it is difficult to obtain the usual microwave and millimeter-wave characteristics. Furthermore, in a case where pressure is applied from above, there are instances where Teflon or the like having a low dielectric constant is used. However, this merely gives an assist in microwave and millimeter-wave applications and the package of a transistor, MIC or MMIC cannot be secured by pressure alone.

With regard to dissipation of heat, configurations in which the heat is brought from the heat-producing portion to the heat-dissipating portion by utilizing a graphite sheet have been considered, as seen in the Japanese Patent Application Laid-Open Nos. 8-23183, 11-110084 and Japanese Patent Application Nos. 11-149329, 10-3333202, 11-128567 and 10-51170. However, these examples of the prior art give no consideration to the problem of ground, which is specific to microwaves. Further, though the graphite sheet has a high thermal conductivity in the transverse direction and therefore has some degree of effectiveness, the sheet has little thickness and exhibits only a small amount of heat transport. For example, if the amount of heat evolved by a transistor, MIC or MMIC is greater than 100 W, it is difficult to lower the channel temperature of the transistor by more than 10° C. Further, in the case of a microwave or millimeter-wave circuit, the circuit board is very nearby and therefore it is necessary to transport heat while avoiding the circuit board. In other words, heat can only be transported from portions not related to the RF characteristic, in which case the amount of heat transported is small and satisfactory effects are not obtained.

For example, Japanese Patent Application Laid-Open No. 8-21183 discloses a cooling structure for cooling a heated member in a low-frequency circuit, i.e., a cooling structure for a heat-producing member characterized by inclusion of a heat-dissipating part made of graphite exhibiting a high degree of alignment. It is indicated that the heat-dissipating part in this cooling structure may be ① a heat sink for cooling an electronic part that is a member evolving heat, ② a sealing member for sealing an electronic part that is a member evolving heat, or ③ a heat-dissipating member connecting an electronic part that is a member evolving heat and a heat-dissipating body for dissipating heat.

According to method ①, the heat-dissipating characteristic of the heat sink is excellent. However, in a case where the heat-producing body is placed inside a package, as in a microwave or millimeter-wave circuit, a problem which arises is that a satisfactory heat-dissipating effect is not obtained unless there is sufficient thermal transfer from the package to the heat sink. Further, according to method ②, it is required that the sheet have an adhesive function. The graphite sheet described, however, does not illustrate an adhesive function. If an adhesive is used, the thermal conductivity will decline owing to the adhesive and the heat-dissipating effect will be degraded. According to method ③, the connecting member has a shape of the kind shown in FIG. 1 of Japanese Patent Application Laid-Open No. 8-21183. However, owing to the small thickness of the sheet, the amount of heat transported is small. For example, if the amount of heat evolved by a transistor, MIC or MMIC is 100 W, it is difficult to lower the channel temperature of the transistor by more than 10° C.

Further, as illustrated in Japanese Patent Application Laid-Open No. 10-283650, there is an example in which a heat sink is fixed using a connecting member in a laser-beam generating apparatus. Though circuit devices can be used independently in a case where there is no relation to frequency, as in this example, the microwave circuit is such that another microwave circuit is in close proximity to the surroundings. This arrangement is not practical. Further, with the method using a connecting member, a problem which arises is that a new member referred to as a connecting member is required. That is, in a case where the package is fixed, the connecting-member material and connecting conditions are required and a problem which arises is an increase in member other than the usual screws for fastening the package.

A structure that allows heat to escape using an indium sheet is illustrated in Japanese Patent Application Laid-Open No. 5-75283. However, indium has almost no restoring force, undergoes deformation with use over an extended period of time, a gap is produced between itself and the case and the heated body may peel off. Problems arise in terms of thermal conductivity and maintenance of ground.

The foregoing is prior art for dissipating heat that has evolved from the heated body. With a high-frequency circuit or high-speed digital circuit that uses superconductivity for dealing with microwave and millimeter-wave high-frequency electromagnetic components, it is required that members be kept at extremely low temperatures. FIGS. 23A and 23B are diagrams for describing a cooling structure. FIG. 23A is a perspective view in which an upper cover 10 of a high-frequency circuit device employing superconductivity has been removed, and FIG. 23B is a sectional view taken along line A'A of the upper cover. A base metal board (Invar, Kovar, copper) 13 on which a superconducting RF circuit board 12 has been mounted is secured to a case 11 by board-mounting screws 14a to 14f. Indium sheets 15a, 15b for removing heat are laid between the case 11 and base metal board 13 and between the superconducting RF circuit board 12 and the base metal board 13. Furthermore, the case 11 is secured on a cold head 16 by screws 17a, 17b via an indium sheet 15c. The arrangement is such that a coolant such as LN or LHe is passed through the interior of the cooling end 16 or such that cooled He gas fed from a refrigerator (not shown) is passed through the cooling end. At an operating temperature of about 4K that adopts liquefied He (LHe) as the coolant, a superconducting RF circuit that uses an Nb superconducting film or YBCO, BSCCO film can be cooled. At an operating temperature of about 77K that adopts liquefied nitrogen as the coolant, or at 50 to 80K using a refrigerator, a superconducting RF circuit that uses YBCO or BSCCO film can be cooled. In FIG. 23A, reference numeral 18 denotes a superconducting film pattern on the superconducting RF circuit board 12, reference numerals 19a, 19b denote coaxial connectors, and reference numerals 20 to 20d denote holes for receiving screws.

The evolution of heat by a circuit in a portion to be cooled is smaller by an order of magnitude in comparison with ordinary semiconductor circuits and wiring. However, heat that penetrates from the exterior of the cooling device penetrates the portion to be cooled (the superconducting RF circuit board 12) through the case 11. The rise in temperature owing to penetration of heat is lowered by the cold head 16. However, the indium sheets 15a to 15c exhibit almost no restoring force and have adhesion to with respect to many case materials and boards. When the case 11 is removed, therefore, the indium sheet 15c undergoes shape deformation and re-use in the same shape is difficult. In case of re-use, a gap tends to form between the sheet and case, temperature unevenness develops within the board and often it is difficult to achieve active operation and transmission-circuit operation by superconductivity with a high degree of reproducibility.

Further, in the cooling structure of FIGS. 23A, 23B, problems are EMC, vibration in the internal circuitry and degradation of characteristics. The case 11 of the microwave or millimeter-wave circuit usually has the cover 10 and a bottom cover fixed to it by screws 17a to 17b. Since a gap is formed in such case, radio waves leak from the gap, thereby bringing about the problems EMC, vibration in the internal circuitry and degradation of characteristics. EMC involves two phenomena, namely leakage of radio waves to the outside and penetration of external radio waves. Vibration is caused by part of the output being fed back to the input through the gap. Further, the degradation of characteristics also is caused by coupling between circuits through the gap. For example, this leads to a frequency characteristic exhibiting a break.

SUMMARY OF THE INVENTION

Accordingly, an object of the present invention is to provide a mounting structure for efficiently dissipating heat evolved by a package internally incorporating at least one of a high-frequency transistor, MIC and MMCI used in the microwave band or millimeter-wave band, thereby making it possible to readily obtain a thermally excellent state.

Another object of the present invention is to provide a mounting structure for mounting a superconducting circuit board and a graphite sheet that require thermal uniformity on a case by fastening them together with screws, thereby making it possible to readily obtain a thermally excellent state without sacrificing microwave characteristics.

A first aspect of the present invention is a package mounting structure for mounting a package on a case, the package internally incorporating at least one of a high-frequency transistor, MIC and MMIC used in the microwave to millimeter-wave band, a base thereof being formed of metal and serving as ground.

In the first mounting structure, an electrically conductive sheet, e.g., a graphite sheet, having excellent thermal conductivity and exhibiting restorability and having a size identical with that of the base of the package is laid on the case at a package-bearing location, and the package and sheet are fastened together and attached to the case by two or more screws. In this case, the package is provided with fully open or half-open holes, the case is provided with screw holes, portions through which the screws are passed are made sheetless, and by fastening the package and sheet together by screws, the sheet is mounted on the case while the sheet is pressed by a pressing force of 10 N/cm$^2$ or greater. In accordance with the first mounting structure, a rise in the temperature of the package can be suppressed through a simple method, a thermally excellent state can be obtained and electrical characteristics such as power application efficiency can be improved.

In a second mounting structure, in a case where steps are present between a package-bearing location and circuit-board-bearing location on the case, step portions, which are among step portions on four sides of the package-bearing location and through which microwaves do not pass, are inclined, an electrically conductive sheet having excellent thermal conductivity and exhibiting restorability is laid on the case on the entirety of the package- and circuit-board-bearing locations, and each of the package and circuit board and the sheet are fastened together and attached to the case by two or more screws. In this case, holes are provided in the sheet at portions through which the screws are passed, thereby resulting in a sheetless state, and by fastening the package and sheet together by screws, the sheet is mounted on the case while the sheet is pressed by a pressing force of 10 N/cm$^2$ or greater. In accordance with the second mounting structure, besides effects similar to those of the first mounting structure, the sheet is prevented from being severed by the inclined step portion and grounding of the entire sheet can be maintained.

A second aspect of the present invention is a mounting structure for mounting a superconducting circuit board in a metal case. In this mounting structure, an electrically conductive sheet, e.g., a graphite sheet, having excellent thermal conductivity and exhibiting restorability is laid on the bottom of a box-shaped metal case, a superconducting circuit board is placed on the sheet, and the superconducting circuit board and sheet are fastened together and attached to the metal case by two or more screws. In this case, holes are provided in the sheet at portions through which the screws are passed, thereby resulting in a sheetless state, and by fastening the package and sheet together by the screws, the sheet board is mounted on the case while the sheet is pressed by a pressing force of 10 N/cm$^2$ or greater. Further, another electrically conductive sheet exhibiting restorability and provided with holes at portions through which screws are passed is placed on peripheral top portions of the box-shaped metal case, a cover of the case is placed thereon, and the cover and sheet are fastened together by screws to seal the interior of the case. Further, a recess (groove) smaller than the thickness of the sheet is formed in either the peripheral top portion or cover of the case to thereby strengthen the degree of sealing. In accordance with this mounting structure, the superconducting circuit board, which requires thermal uniformity, and the graphite sheet are fastened together by screws to mount the superconducting circuit board on the case, thereby making it possible to readily obtain a thermally excellent state without sacrificing microwave characteristics.

DESCRIPTION OF THE PREFERRED EMBODIMENTS

(A) Principles of the Invention

It is important to so arrange it that heat produced by a package can be dissipated efficiently with almost no modification in the mounting of ordinary microwave to millimeter-wave circuits. To accomplish this, a sheet should be as follows:

① it should have excellent electrical conductivity without any change in microwave characteristics;

② it should have a restoration force in the manner of a cushion and should maintain the restoration force for a long period of time; and ③ it should be electrically conductive in air and be mountable on a case when fastened together with a package by screws.

Furthermore, if a sheet-like member is used, it is not in liquefied form in the manner of grease and therefore mounting is simplified.

A graphite-sheet structure is available as a sheet having the above-mentioned properties, and the method of manufacture is known from, e.g., Japanese Patent Application Laid-Open No. 10-345665. Further, though a graphite sheet is ideal as the sheet, a second-best sheet is an SiC substrate, etc., on which a carbon nanotube film (having a thickness of 200 nm or greater) has been formed. This also is effective because it has properties similar to those of the graphite sheet in that the carbon nanotube film portion has restorability. Further, with a package or the like for microwave to millimeter-wave circuits, the package serves as ground. A package with little electrical conductivity is a problem because satisfactory grounding cannot be achieved. However, the above-mentioned graphite sheet and SiC substrate on which the carbon nanotube film has been formed have excellent electrical conductivity and exhibit no degradation in microwave characteristics ascribable to poor grounding.

When the package and sheet are fastened together and mounted on the case by screws, it is required that mounting be performed while subjecting the sheet to considerable pressing force, e.g., a pressing force of 10 N/cm² or greater. This is to bring the sheet and the package as well as the sheet and case into intimate contact (surface contact). By virtue of surface contact, the efficiency of thermal conduction is improved and satisfactory grounding is achieved, thereby making it possible to prevent degradation of microwave characteristics.

Figure 1:
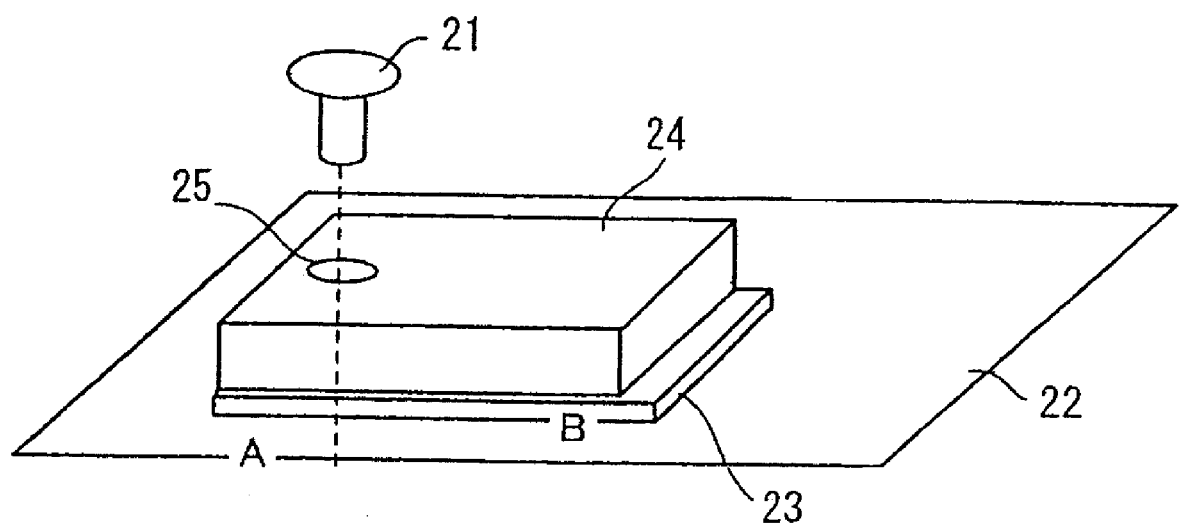
FIG. 1 is an explanatory view of a mounting method for fastening a package and a sheet together and mounting them on a case by a single screw.

The fastening together of the package and sheet by screws is applicable to the package of a comparatively small (50 to 300 mm² at most) microwave circuit. The reason for this is that the package of the microwave circuit is usually secured by screws. By using screws, the sheet can be subjected to a pressing force greater than that achieved by securing with pins. Further, with use of a single screw 21, as shown in FIG. 1, the pressure at the periphery at point B devoid of a screw is small and therefore not enough force is obtained to transfer heat. For this reason, two or more screws are required. In FIG. 1, reference numeral 22 denotes the surface of a case, 23 a thermally conductive sheet, 24 a package and 25 hole into which the screw is inserted.

Figure 21:
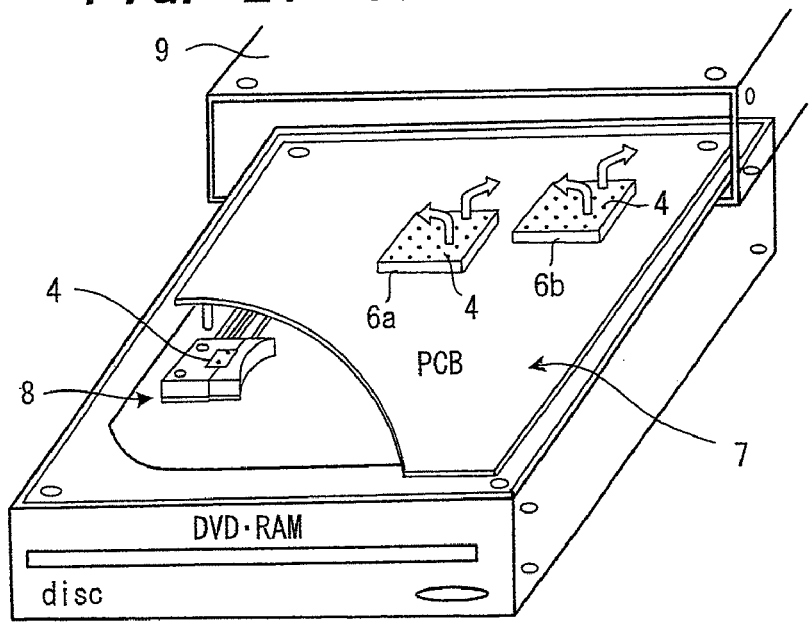
FIG. 21 is a second explanatory view of a mounting method using a graphite sheet according to the prior art.
Figure 22:
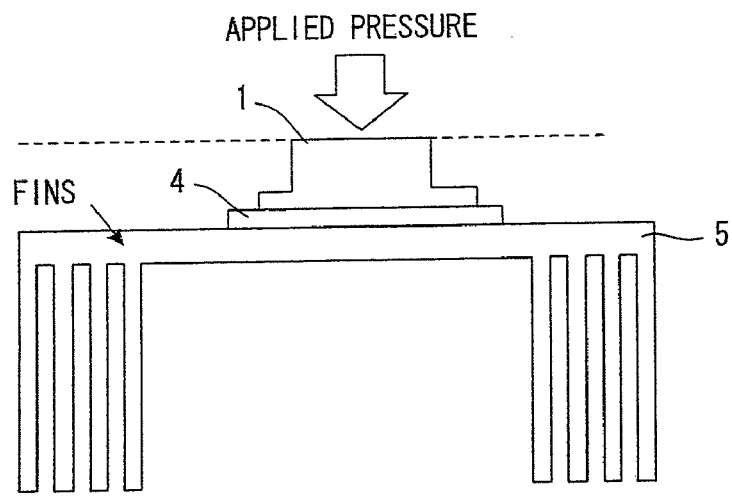
FIG. 22 is a third explanatory view of a mounting method using a graphite sheet according to the prior art.
Figure 23A:
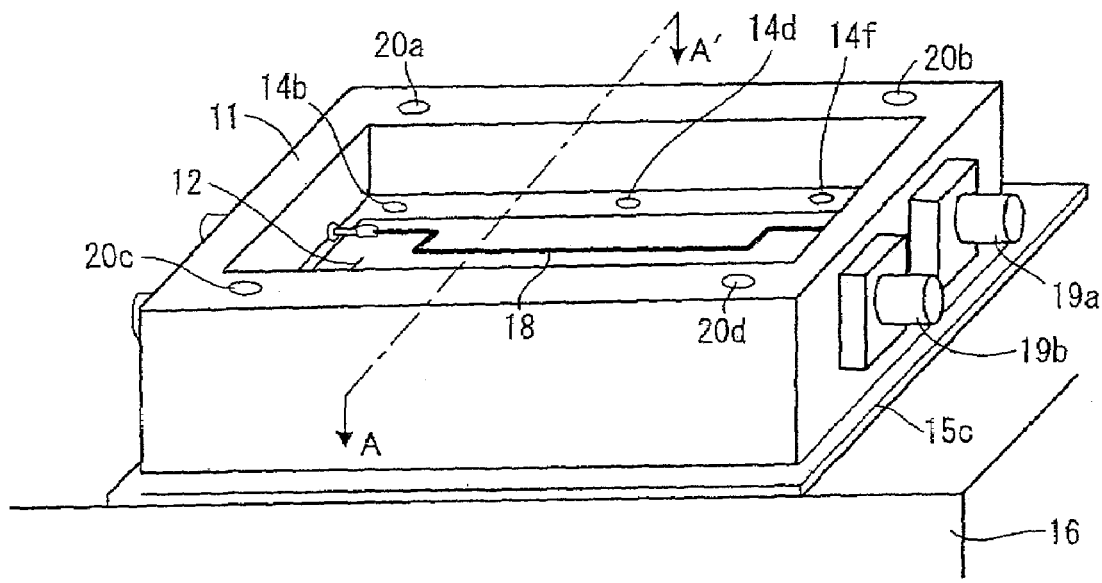
FIGS. 23A, 23B are diagrams for describing a cooling structure according to the prior art.
Figure 23B:
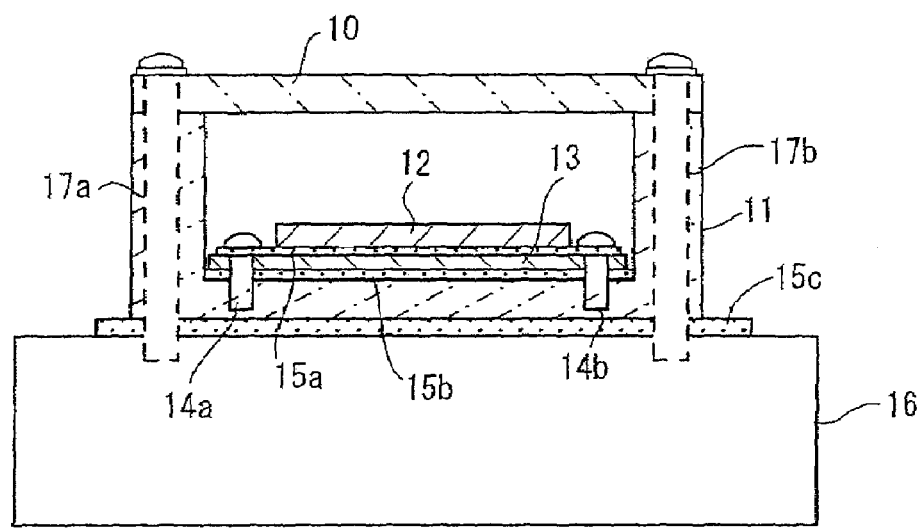

By virtue of the method of fastening the package and sheet together by two or more screws and mounting them on the case while pressing the sheet with a pressing force of 10 N/cm² or greater, the problem set forth in Japanese Patent Application Laid-Open No. 8-23183 already described can be solved and so can the problem of poor thermal conductivity owing to weak pressure or adhesive material illustrated in FIG. 21. Further, it is unnecessary to restrain the sheet by screws from above using a special jig.

Since the sheet is thin, there is little effect even if heat is transferred from the heat-producing body to the heat sink by making a connection to the heat sink, as in Japanese Patent Application Laid-Open No. 8-23183. However, by laying the sheet directly beneath the heat-producing body of the package, fastening the sheet and package together by screws and applying a pressing force of 10 N/cm² or greater to the sheet to achieve mounting on the case, it is possible to transfer heat to the area directly underlying the pressing force and suppress a rise in the temperature of the package.

Here it is necessary that the signal propagation portion extend as close as possible to the position of ground in the microwave or millimeter-wave circuit. It is required, therefore, that the size of the sheet be the same as that of the package (i.e., that the overall sheet be ground). Further, performance will be unaffected even if the sizes of the package and sheet differ somewhat in a direction in which there is no microwave or millimeter-wave signal, i.e., in a direction at right angles to the direction in which microwaves propagate.

(B) First Embodiment

Figure 2:
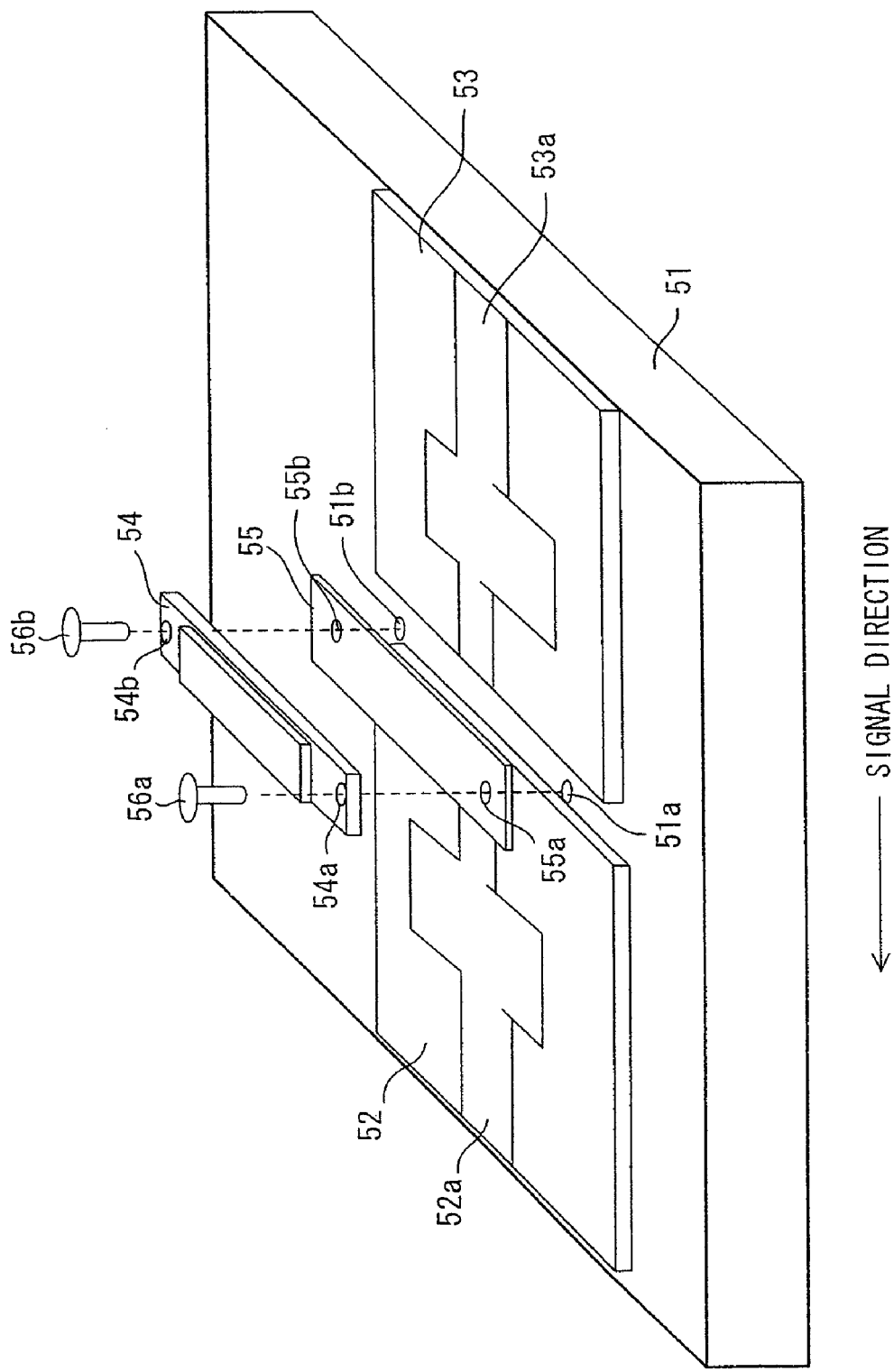
FIG. 2 is an exploded perspective view illustrating a package mounting structure according to a first embodiment.
Figure 3:
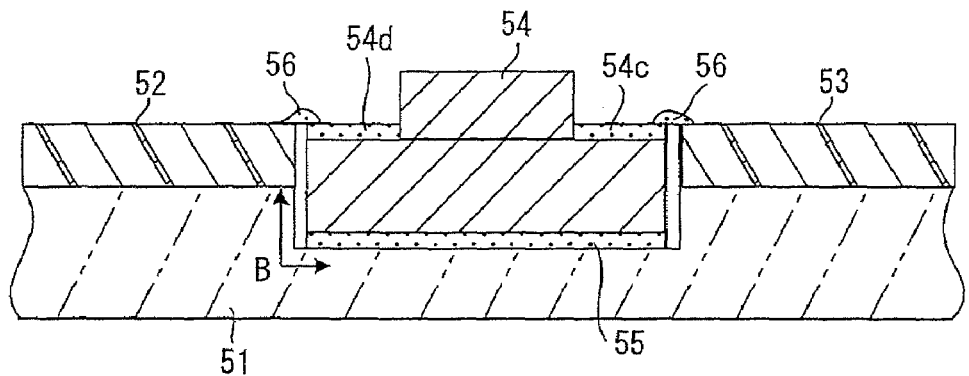
FIG. 3 is a sectional view in case of sectioning along signal direction.
Figure 4:
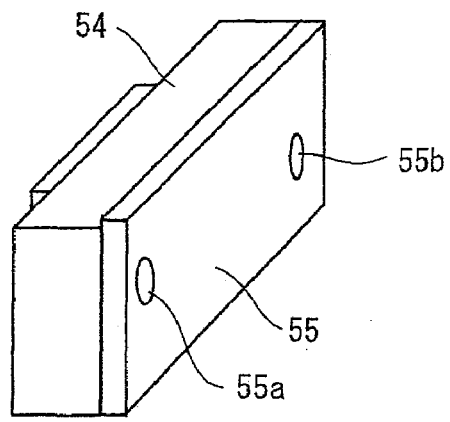
FIG. 4 is a diagram for describing sizes of a package and graphite sheet.

FIG. 2 is an exploded perspective view illustrating a package mounting structure according to a first embodiment, FIG. 3 a sectional view in case of sectioning along signal direction, and FIG. 4 a diagram for describing sizes of a package and graphite sheet. Circuit boards 52, 53 on which microstrips have been patterned are placed on a case (heat sink) 51, which serves as a heat-dissipating member, so as to sandwich a package 54 between them. Further, screw holes 51a, 51b for attaching the package are formed in the case 51.

The package 54 internally incorporates at least one of a high-frequency transistor, MIC and MMIC used in the microwave to millimeter-wave band. The package has the external shape of a projection and the base portion thereof is formed at both ends to have holes 54a, 54b through which screws 56a, 56b for attaching the package are inserted. Further, packet input/output terminals 54c, 54d (not shown in FIG. 2; refer to FIG. 3) are formed on both sides of the protruding portion of the package. The sheet 55 has a size the same as that of the base of package 54 (see FIG. 4) and the portions through which the screws 56a, 56b are passed are opened to form holes 55a, 55b, whereby a sheetless state is obtained. The sheet 55 is required to have a restorability of 20% or greater, good thermal conductivity and electrical conductivity. An example is a graphite sheet.

Figure 5:
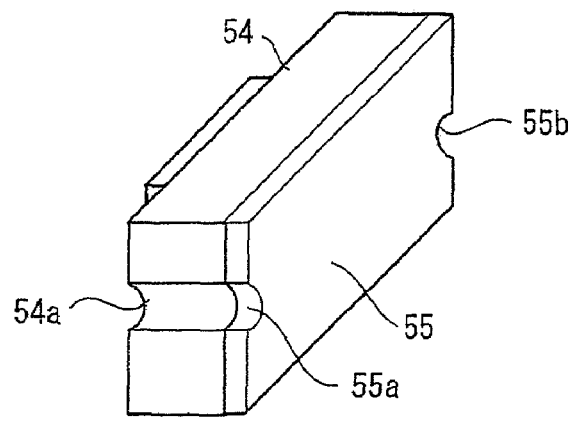
FIG. 5 is a diagram for describing holes in a package and graphite sheet.

To attach the package to the case, the graphite sheet 55 is laid on the case 51 on the package-bearing location in such a manner that the holes 55a, 55b will align with the screw holes 51a, 51b, then the package 54 is placed thereon in such a manner that the holes 54a, 54b will align with the holes 55a, 55b, and two or more (two in the illustration) screws 56a, 56b are inserted into the respective holes and the package 54 and sheet 55 are fastened together and attached to the case 51. In this case, it is required that mounting on the case 51 be performed while pressing the sheet 55 with a prescribed pressing force by tightening the screws. Finally, the microstrips on the circuit boards 52, 53 and the input/output terminals 54c, 54d (see FIG. 3) of the package are connected by solder 56. It should be noted that the holes 54a, 54b and 55a, 55b provided in the package 54 and sheet 55 can be half-open holes, as shown in FIG. 5.

Figure 6:
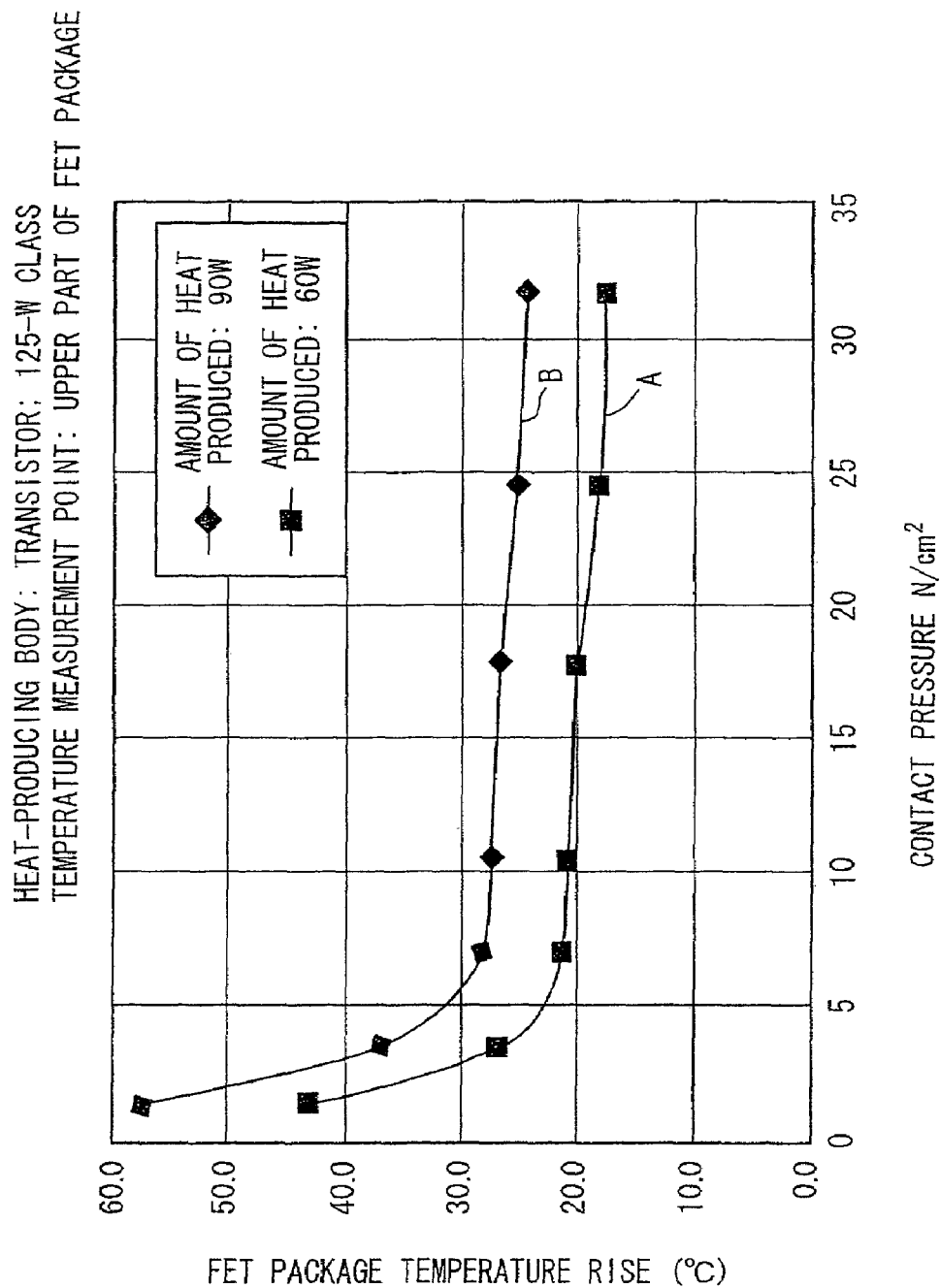
FIG. 6 is a diagram showing the relationship between contact pressure of a package and temperature rise of the package for the purpose of deciding pressing force.

FIG. 6 is a diagram showing the relationship between contact pressure of the package and temperature rise of the package for the purpose of deciding pressing force. Cases where amount of heat evolved is 60 W (curve A) and 90 W (curve B) are illustrated. The horizontal axis is a plot of contact pressure (N/cm²) and the vertical axis a plot of package temperature rise. The rate of temperature rise differs about a boundary of 5 to 10 (N/cm²) irrespective of the type of sheet or amount of heat evolved. It will be understood from this characteristic diagram that the rise in the temperature of the package can be suppressed if a contact pressure of 10 (N/cm²) or greater is applied.

Figure 7:
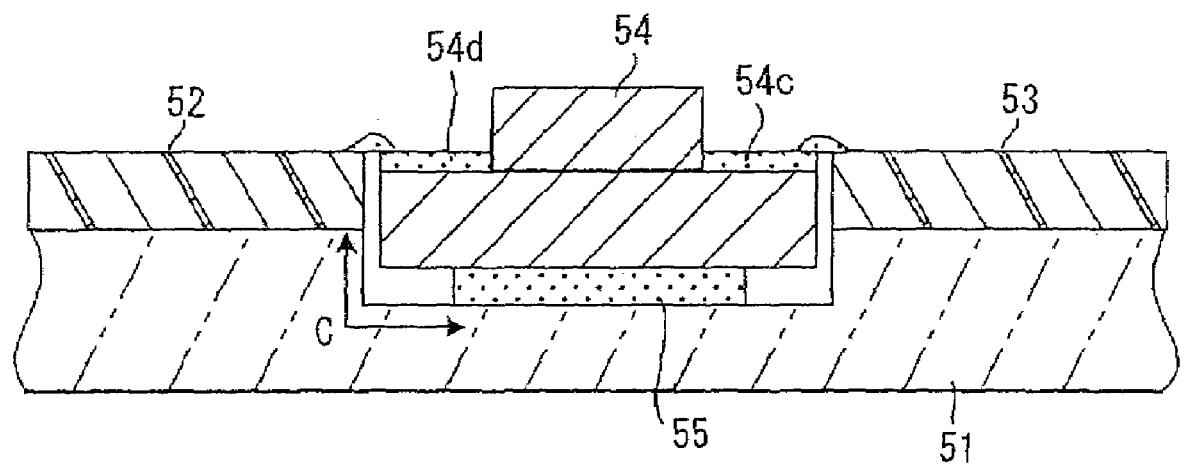
FIG. 7 is a sectional view of a modification in which the size of a sheet is made smaller than the base size of a package and the same as the size of a heat-producing portion of the package.
Figure 8:
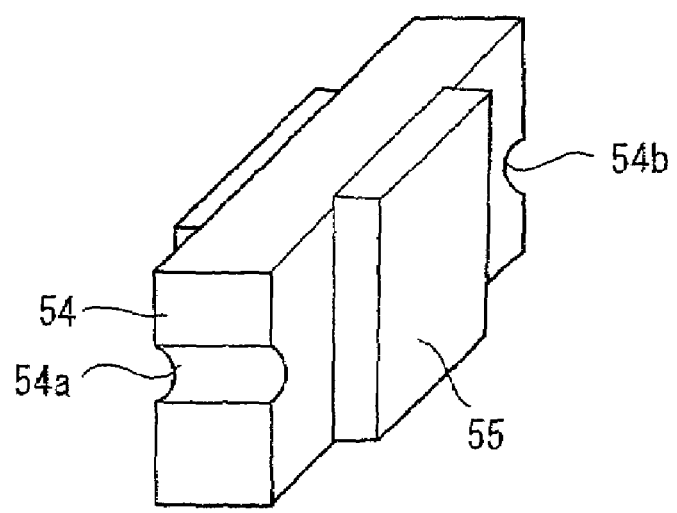
FIG. 8 is a diagram for describing sizes of a package and graphite sheet in a modification.

FIG. 7 is a sectional view of a modification in which the size of the sheet 55 is made smaller than the base size of the package and the same as the size of a heat-producing portion of the package, and FIG. 8 is a diagram for describing sizes of the package and graphite sheet in the modification. Portions identical with those shown in FIGS. 3 and 4 are designated by like reference characters.

The state of ground in the first embodiment and modification will be understood from FIGS. 3 and 7. Specifically, in the first embodiment, grounding of the package 54 is achieved satisfactorily from the entirety of its base surface because the sheet 55 has an electrical conductivity equivalent to that of metal. In the modification, however, part of the base is not grounded. Thermally speaking, the first embodiment of FIG. 3 and the modification of FIG. 7 are almost same. With the modification of FIG. 7, however, a problem which arises is that part of the base is remote from ground (the case) and the microwave characteristic is disturbed as a result.

When long-term reliability is considered, it is required that the sheet 55 exhibit a recovery force (restorability of 20% or greater). The reason is that the recovery force allows grounding, which is innately unstable, to be obtained and enhances the heat-escape effect. This effect can be attained by the simple method of jointly fastening the package 54 by the screws 56a, 56b and merely adopting a sheet 55 of a higher price. Here a configuration in which the screw holes through which the screws are passed are provided in the sheet is desirable.

Figure 9:
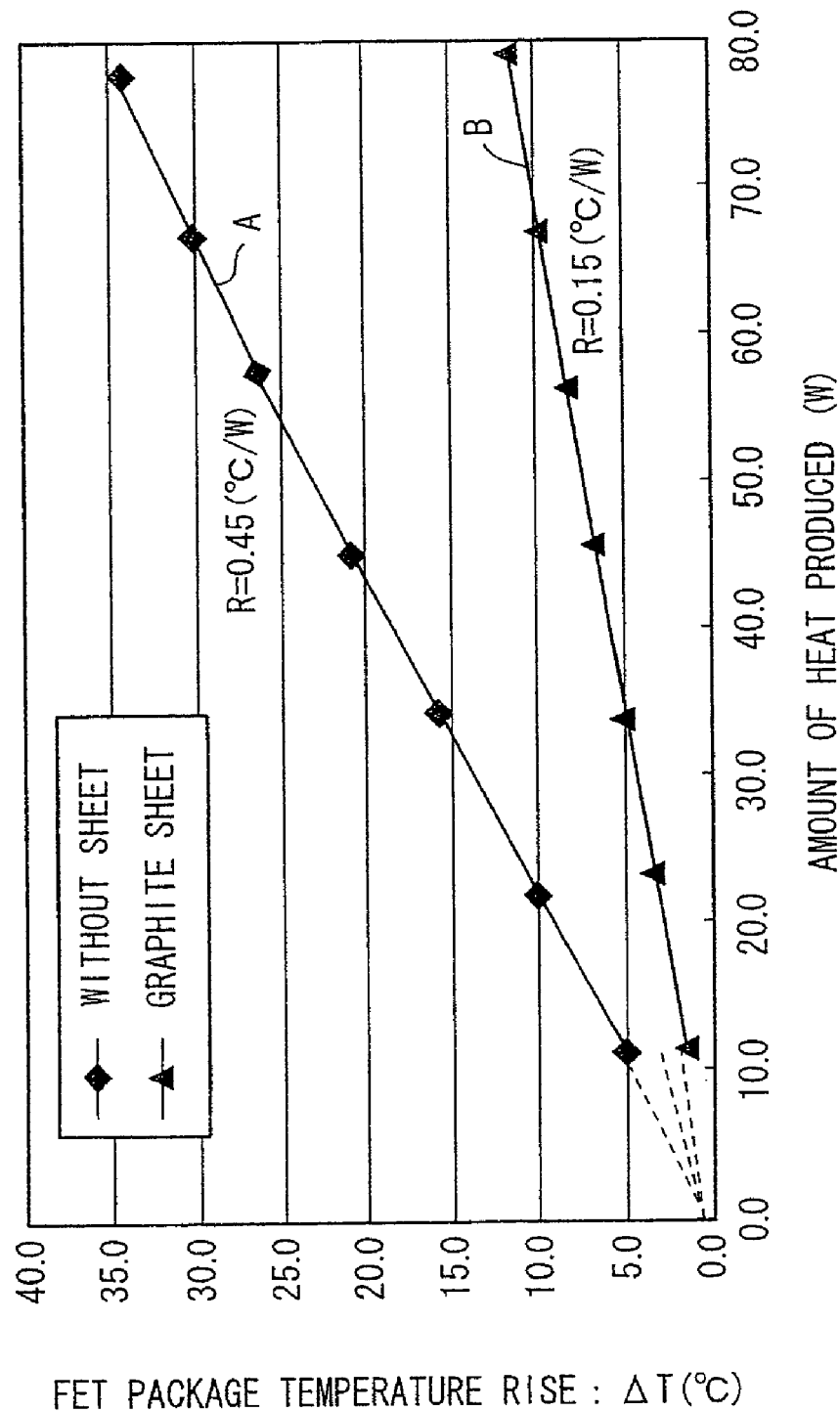
FIG. 9 is a diagram illustrating the relationship between amount of evolved heat and temperature rise of a package.

The amount of heat evolved by accommodating a FET amplifier of a single stage in the package 54 was investigated. In FIG. 2, tightening torque of the two M2.3 screws 56a, 56b is 3.5 kgf. The area below the package 54 is 3.5×1.5 cm=5.25 cm². The sheet 55 used had holes provided in this portion in order to pass screws therethrough. The amount of heat evolved in this case and the value of rise in temperature on the top side of the package are illustrated in FIG. 9. Here reference character A represents a characteristic in the absence of the sheet, and B a characteristic when the sheet is present. It will be appreciated that the characteristic B, which is obtained when the sheet is interposed, is excellent as it is thermally more than double the characteristic A in the absence of the sheet.

Figure 10:
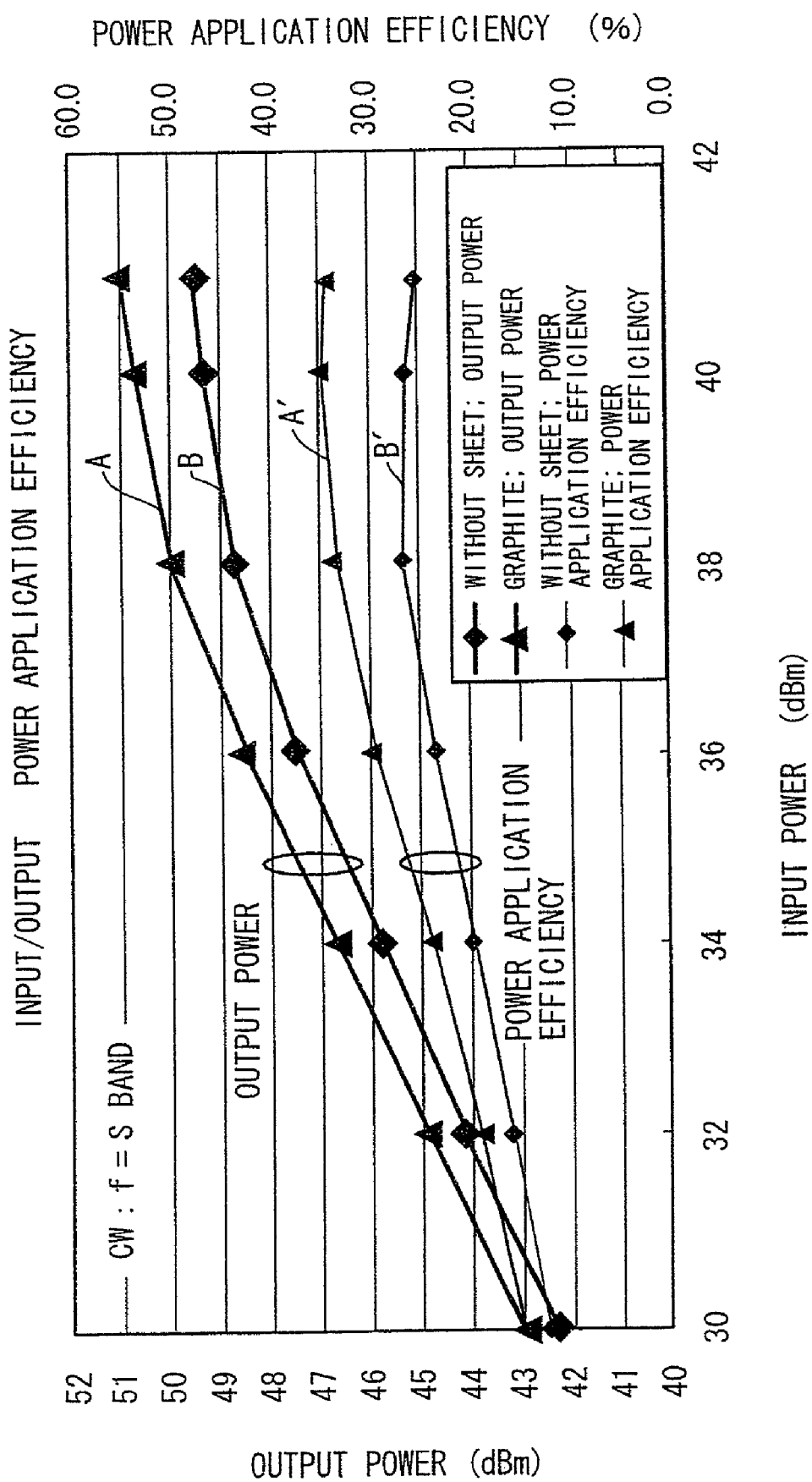
FIG. 10 is a microwave characteristic diagram in cases where a sheet is and is not present.

A problem arises if the microwave characteristic changes. FIG. 10 illustrates the result of experiments for evaluating the microwave characteristic. Here character A represents output voltage when the sheet is present, B the output power in the absence of the sheet, A' the power application efficiency when the sheet is present and B' the power application efficiency in the absence of the sheet. Excellent values are obtained for both the input/output characteristic and efficiency characteristic when the sheet is present. The reason for this is that the electrical conductivity of the sheet is equivalent to that of metal and therefore is excellent, as a result of which the package is grounded over its entire surface. It will be understood that the microwave characteristic is not affected.

Figure 11:
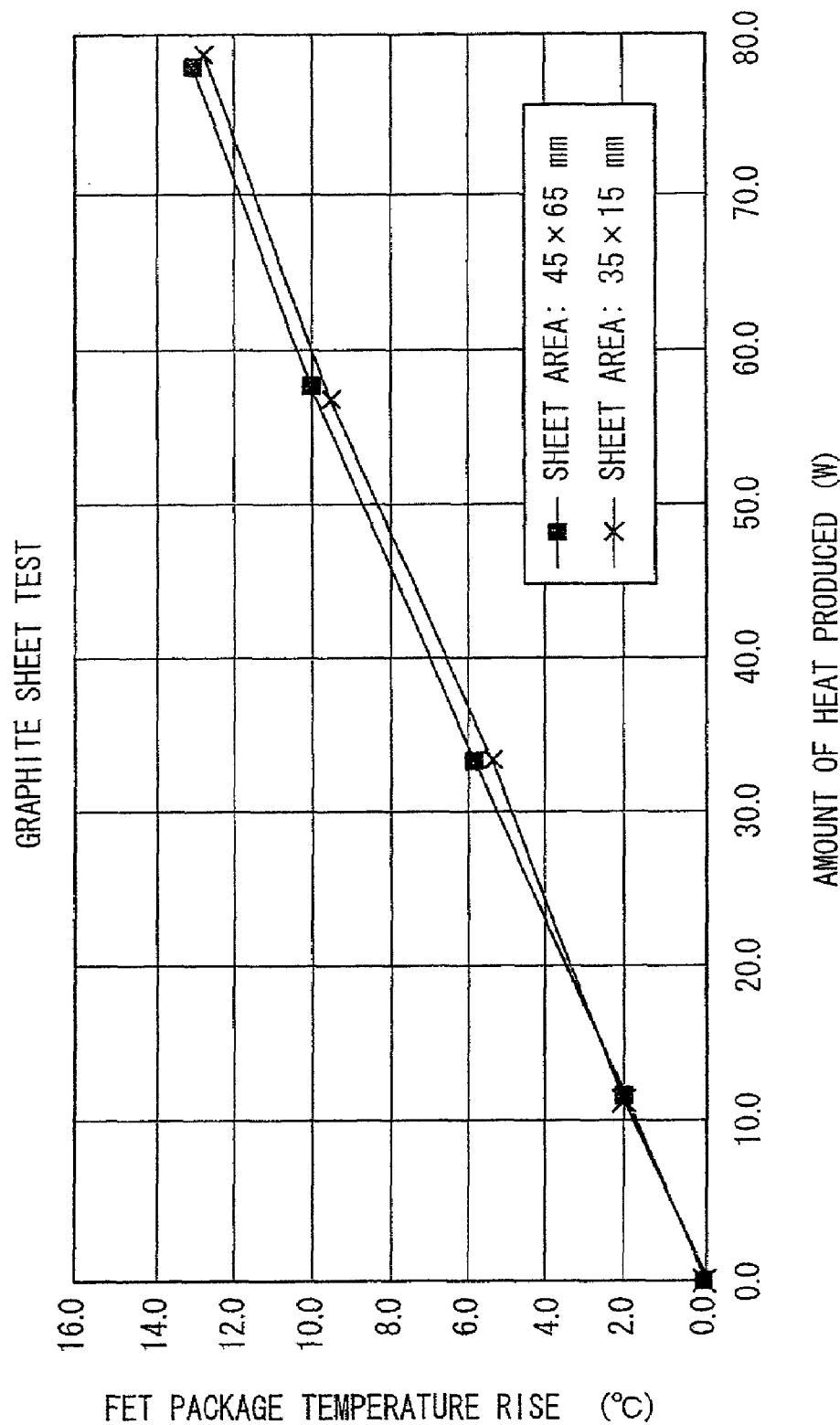
FIG. 11 is a diagram illustrating the relationship between amount of evolved heat and temperature rise when area of the sheet is changed.

Since the sheet 55 is thin, however, there is little effectiveness in terms of allowing heat to spread transversely. For this reason, data concerning a rise in temperature in a case where the area of the sheet 55 is changed was collected. However, the rate of rise in temperature was almost the same, as illustrated in FIG. 11. In particular, with sheet A, the rise in temperature was the same even in a case where the area of the package was made greater than 3.5×1.5 cm. It will be understood from this data also that placing the sheet below the heat-producing body is effective and that a heat-dissipating member in contact with a heat-producing body does not provide much effect.

Figure 12:
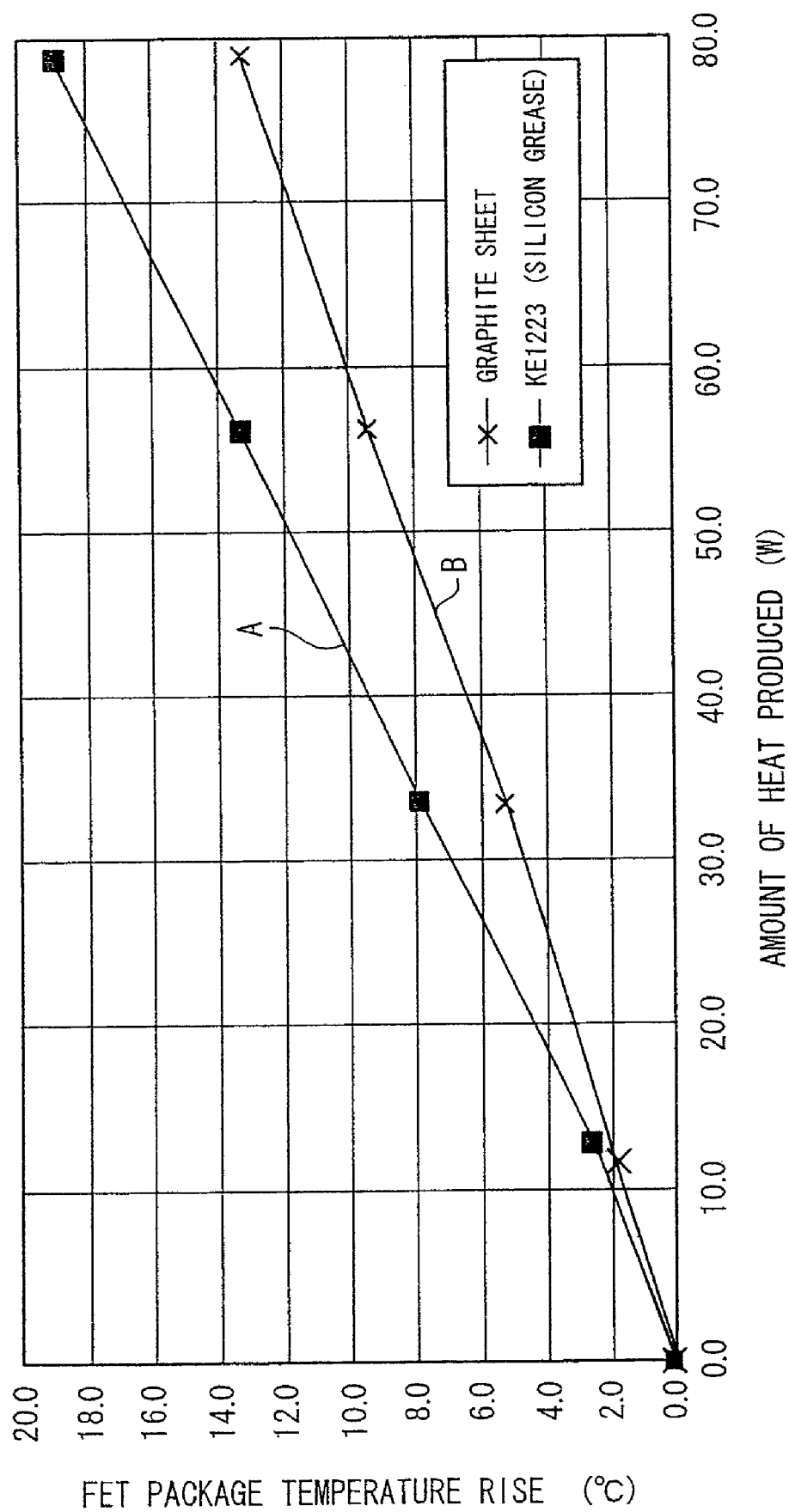
FIG. 12 is a diagram showing a comparison of temperature rise silicon grease and of a sheet.

The values of a rise in package temperature versus amount of heat evolved in a case where the package is embraced by silicon grease (KE1223) and the sheet are plotted in FIG. 12. Reference character A represents the characteristic obtained when silicon grease is interposed and B the characteristic obtained when the sheet is interposed. In terms of the thermal characteristic, it will be understood that the rise in temperature is lower for the sheet to the extent that it has the better thermal conductivity. Since the electrical characteristic cannot be measured in the case of an insulator such as silicon grease, it is not suited to a microwave circuit.

Figure 13:
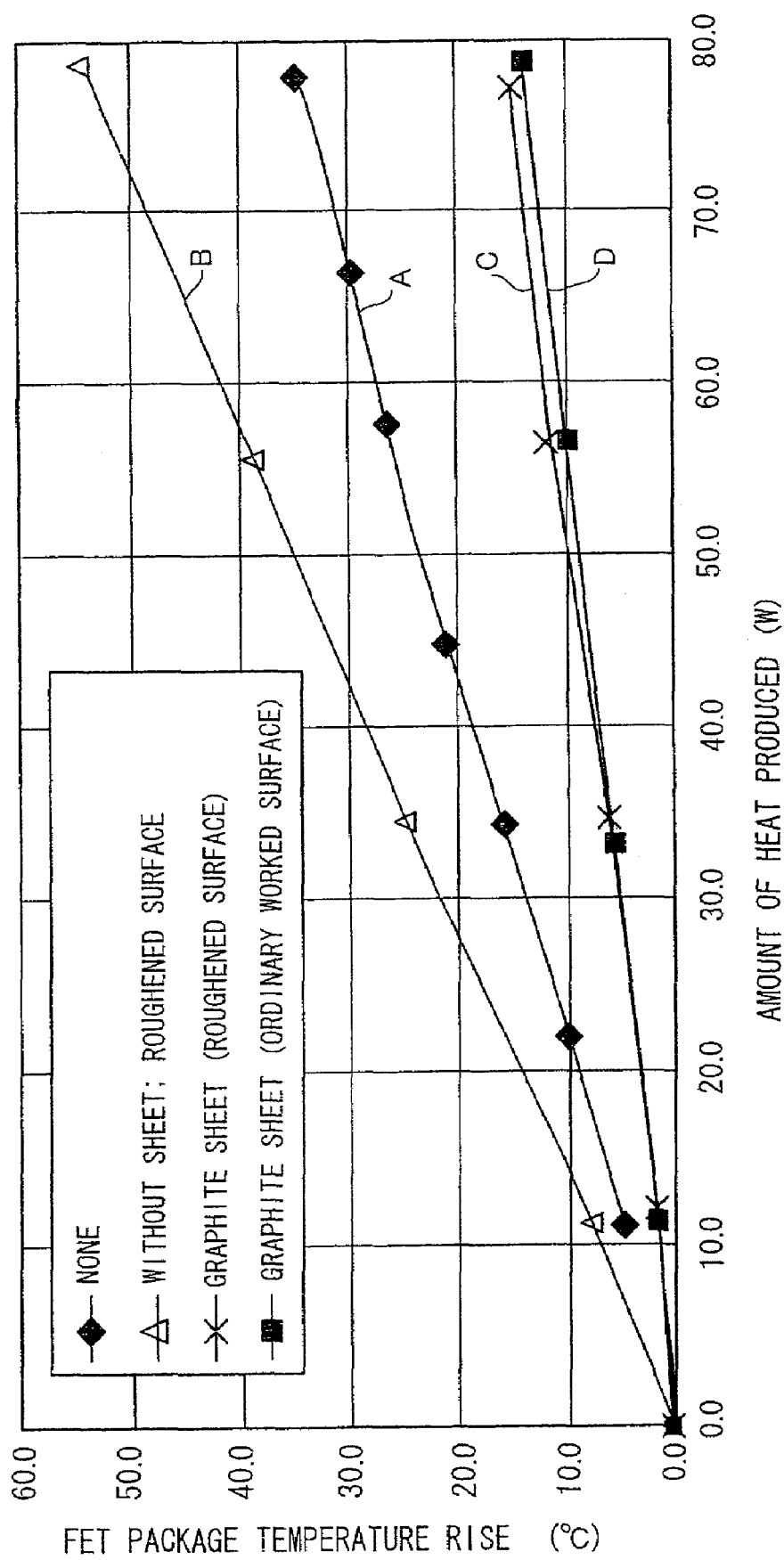
FIG. 13 is a diagram for describing effects of a sheet when the mounting surface is roughened.

FIG. 13 is a characteristic diagram of amount of heat evolved and temperature rise when the surface of the case has been roughened. Here reference character A represents a characteristic in a case where there is no sheet and the surface of the case has not been roughened, B a characteristic in a case where there is no sheet and the surface of the case has been roughened, C a characteristic in a case where a sheet is present and the surface of the case has been roughened and D a characteristic in a case where a sheet is present and the surface of the case has not been roughened. In the absence of the sheet, temperature rose greatly from 32.5° C. to 54.1% at 80 W of evolved heat, or by 166%. When the sheet was interposed and pressure applied thereto by two screws, the rise in temperature was from 13.8° C. to 14.9° C., or a low rate of increase of 108%. It will be understood from the characteristic diagrams of FIGS. 12 and 13 that there is sufficiently close contact between the sheet and case and that the method of the first embodiment is effective.

In accordance with the first embodiment, a sheet having an electrical conductivity equivalent to that of a metal and exhibiting a certain degree of restorability is in contact with the entire surface of the base of a package in a microwave circuit that uses the package. Stable grounding is achieved as a result. Further, since the sheet is in surface contact even in a case where an element evolves heat, paths along which heat flows from a large number of points of point contact are produced and the temperature of the heat-producing element is lowered. Further, the sheet is interposed between the package and case and is secured by a plurality of screws. The sheet can be brought into contact with the package and case while under pressure. Moreover, since the sheet has restorability, it can retain its shape over an extended period of time. Further, only the cost of the sheet rises and there is no such increase in the case of the other components. Hence the invention can be worked without additional cost. Further, since retention is by screws, the position of ground on the upper side is not affected by the height of the package. Further, in accordance with the first embodiment, the channel temperature of the transistor, for example, declines by several tens of degrees centigrade. As a result, gain, saturation output, efficiency and distortion characteristic are improved.

(C) Second Embodiment

Figure 14:
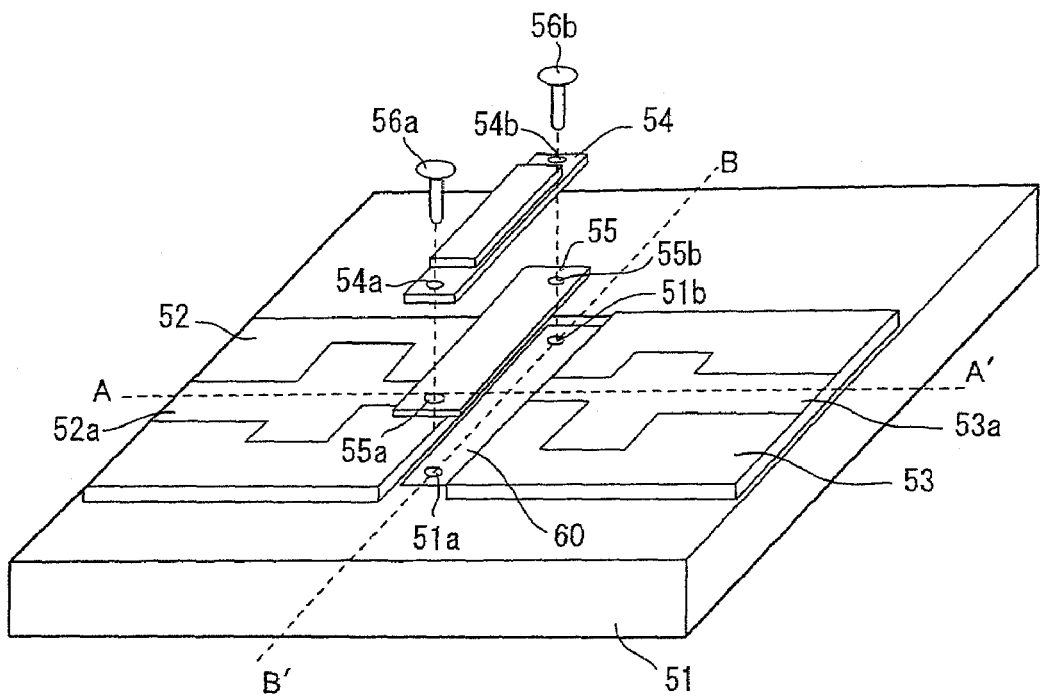
FIG. 14 is an exploded perspective view illustrating a package mounting structure according to a second embodiment.
Figure 15A:
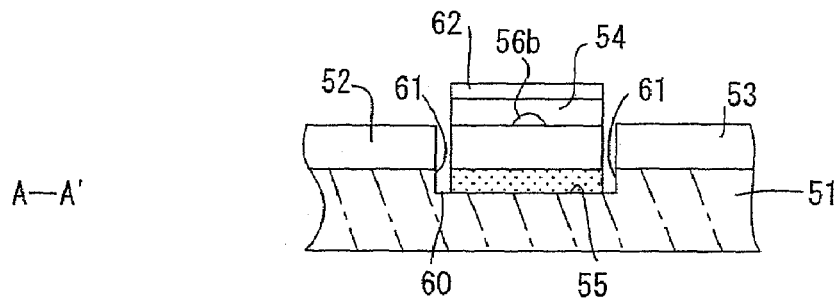
FIGS. 15A, 15B are sectional views of a package mounting structure.
Figure 15B:
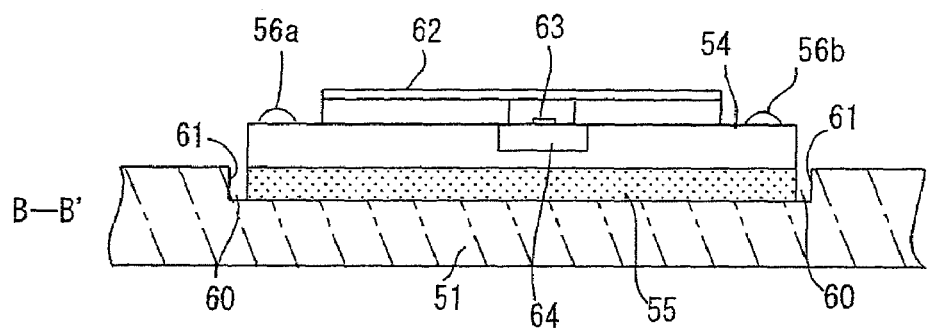

In the first embodiment of FIG. 2, the case 51 is not formed to have a package accommodating portion and therefore positioning the sheet 55 and package 54 when the package is mounted is difficult. FIG. 14 is an exploded perspective view illustrating a package mounting structure according to a second embodiment, FIG. 15A is a sectional view taken along line AA' when sectioning is performed along the signal direction, and FIG. 15B is a sectional view taken along line BB' when sectioning is performed at right angles to the signal direction. Portions identical with those shown in FIGS. 2 and 3 are designated by like reference characters. This embodiment differs from the first embodiment in that the case 51 is formed to have a package accommodating portion 60. Providing the package accommodating portion 60 makes it possible to position the sheet 55 and package 54 in simple fashion merely by placing them in the accommodating portion 60 when the package is mounted. Furthermore, reference number 62 denotes a metal cover, 63 a 50-Ω line and 64 the cross section of a ceramic portion.

(D) Third Embodiment

In the second embodiment, no problems whatsoever arise since a sheet having a size the same as that of the package base need only be set in the accommodating portion 60. However, there are cases where the sheet 55 is laid integrally on the case on the entirety of the locations that bear the package 54 and circuit boards 52, 53, and the package and circuit boards are grounded by the sheet. In such cases, right-angle steps 61 exist at four sides between the location that bears the package 54 and the locations that bear the circuit boards 52, 53, as evident from FIGS. 15A, 15B. Owing to the right-angle steps, the thin sheet 55 is severed by the right-angle portions of the steps 61 when the circuit boards 52, 53 are installed following the laying of the sheet and then the package 54 is set upon the sheet and is fastened by the screws 56a, 56b. Accordingly, in the third embodiment, if steps 61 exist between the package-bearing location and circuit-board-bearing location on the case 51, the step portions through which microwaves do not pass, which step portions are among the step portions on the four sides of the package-bearing location, are inclined.

Figure 16:
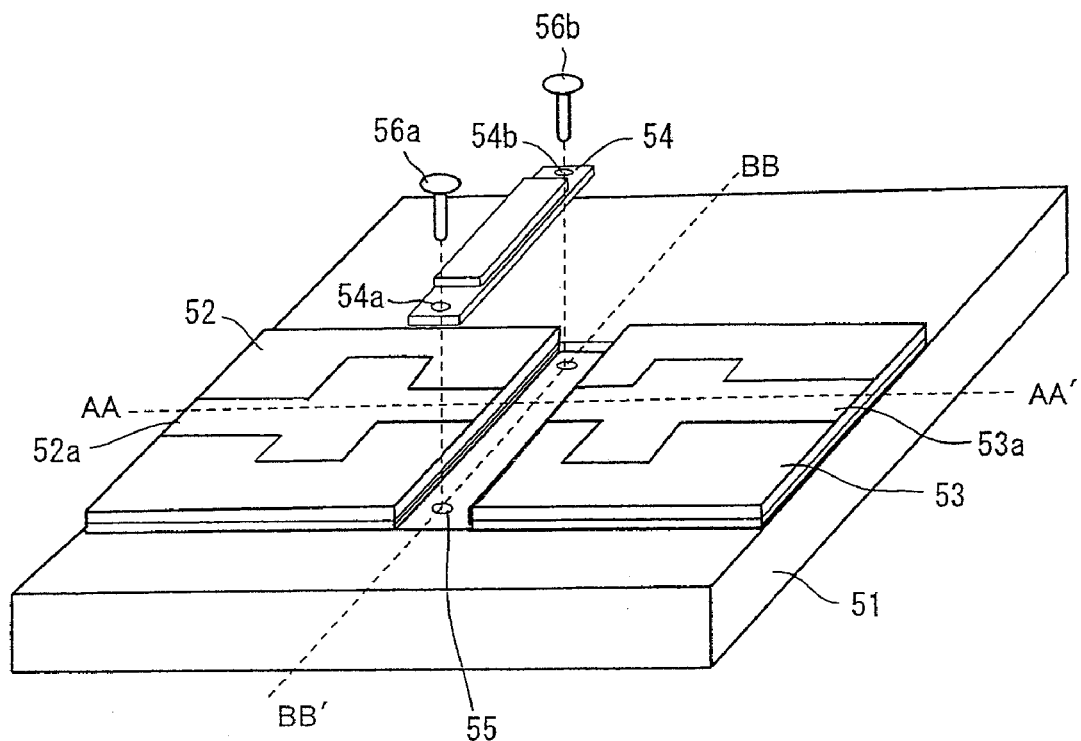
FIG. 16 is an exploded perspective view illustrating a package mounting structure according to a third embodiment.
Figure 17A:
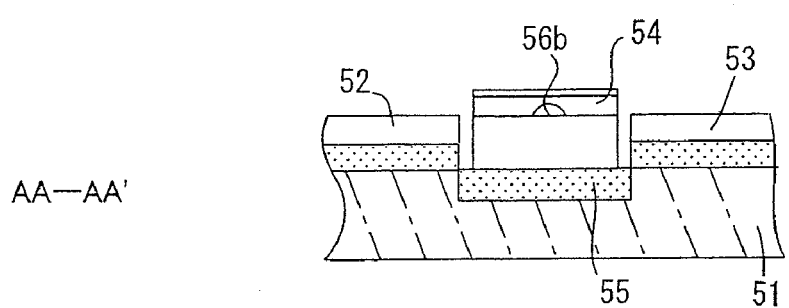
FIGS. 17A, 17B are sectional views of a package mounting structure according to the third embodiment.
Figure 17B:
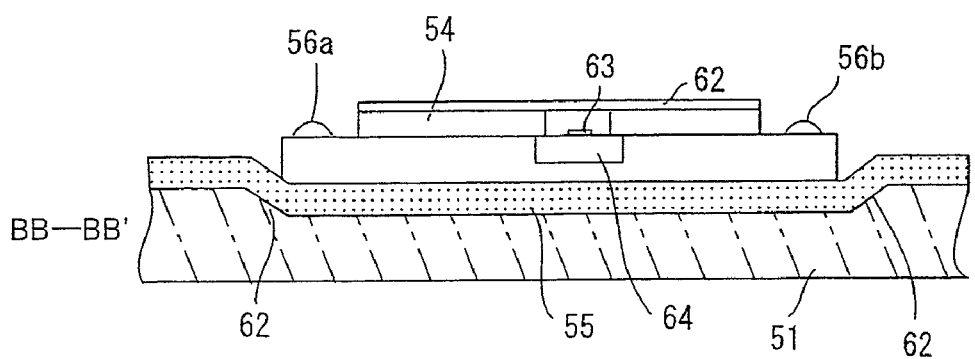

FIG. 16 is an exploded perspective view illustrating a package mounting structure according to the third embodiment. FIG. 17A is a sectional view taken along line AA' when sectioning is performed along the signal direction, and FIG. 17B is a sectional view taken along line BB' when sectioning is performed at right angles to the signal direction. Portions identical with those shown in FIGS. 14, 15A, 15B are designated by like reference characters.

This embodiment differs from the second embodiment in that step portions through which microwaves do not pass, which step portions are among the step portions on the four sides of the accommodating portion 60, are inclined to form slanted step portions 62. If slanting is performed in this manner, the sheet will not be severed at the step portions. More specifically, the sheet will not be severed by the slanted step portions 62 even when the electrically conductive sheet having restorability is laid on the case on the entirety of the package- and circuit-board-bearing locations, the circuit boards 52, 53 are installed on the sheet, the package 55 is subsequently set upon the sheet and both are fastened together by the screws 56a, 56b. As a result, ground potential of the entire sheet can be maintained and the package and circuit boards can be provided with ground. It should be noted that although the illustrated sheet has been provided with incisions at step portions other than the slanted step portions 62, incisions are not necessarily required. The entirety of the circuitry can be constructed by a single sheet. This is an effective method particularly when a plurality of transistors MICs and MMICs are installed.

(E) Fourth Embodiment

Figure 18A:
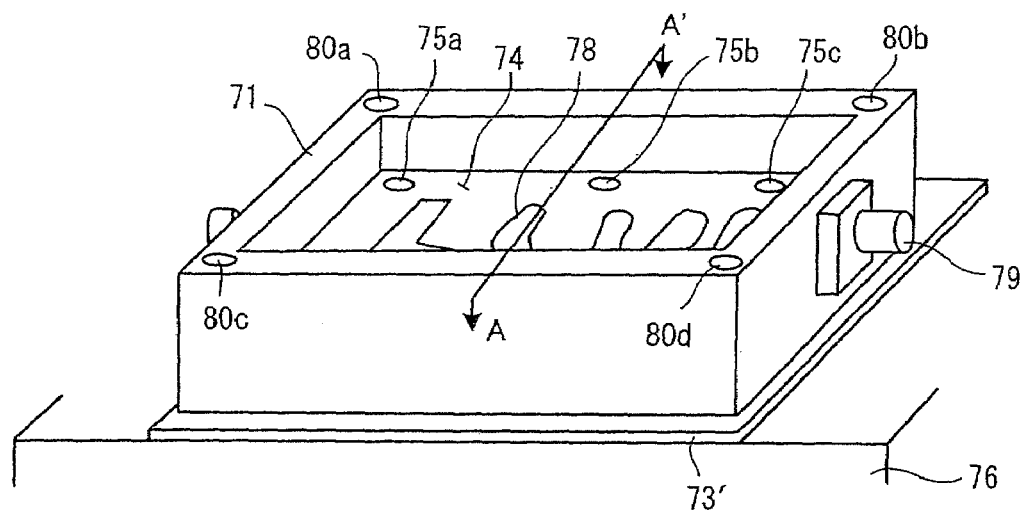
FIGS. 18A, 18B are diagrams useful in describing a mounting structure for mounting a superconducting circuit board on a metal case.
Figure 18B:
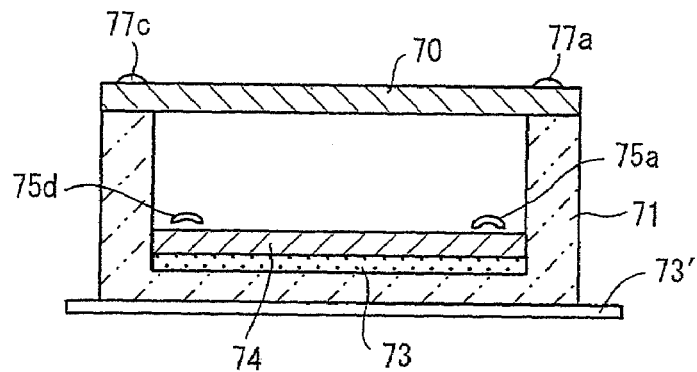
Figure 19:
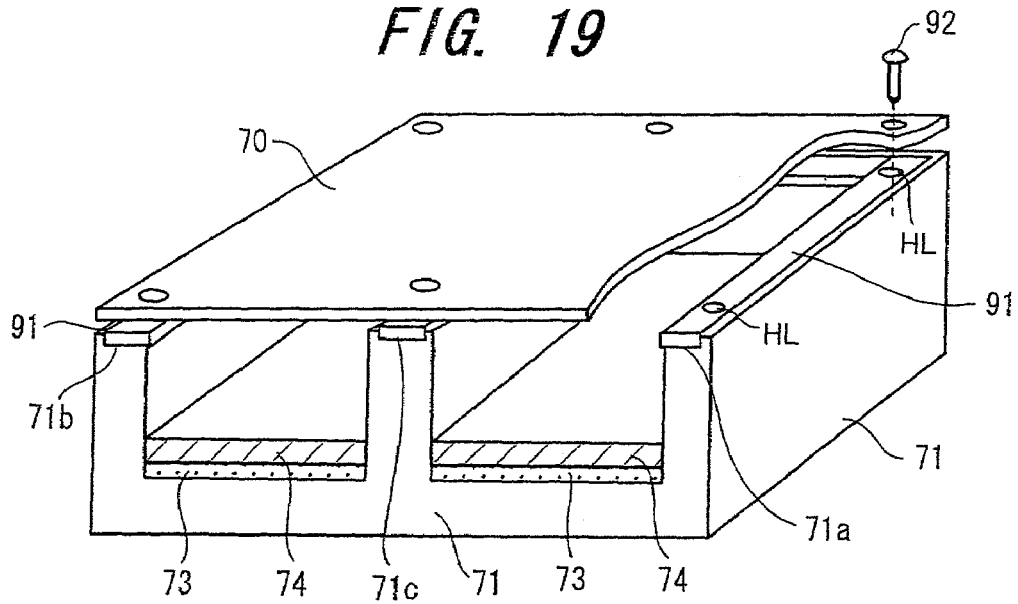
FIG. 19 is diagram useful in describing another mounting structure for mounting a superconducting circuit board on a metal case.
Figure 20:
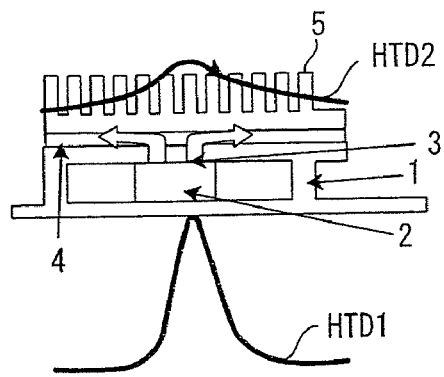
FIG. 20 is a first explanatory view of a mounting method using a graphite sheet according to the prior art.

FIGS. 18A, 18B and FIG. 19 illustrate a fourth embodiment of a mounting structure for mounting a superconducting circuit board on a metal case. FIG. 18A is a perspective view in which an upper cover has been removed, and FIG. 18B is a sectional view along line AA' in which the upper cover has been attached. As illustrated in the drawings, a sheet, e.g., a graphite sheet 73, having excellent thermal conductivity and exhibiting restorability is laid on a bottom of a box-shaped case 71, a superconducting circuit board 74 on which a superconducting RF circuit or the like has been mounted is placed upon the sheet, the superconducting circuit board 74 and sheet 73 are fastened together by two or more screws 75a to 75e, and the sheet 73 is attached to the metal case 71 while being pressed by a prescribed pressing force. The pressing force is 10 N/cm², as in the first embodiment, and the sheet 73 is mounted on the case 71 while being pressed by this pressing force. The size of the sheet is the same as that of the circuit board. A graphite sheet 73' is laid on a cold head 76, the case 71 is placed upon this sheet and the sheet is fixed by four screws 77a, 77c, . . . . The arrangement is such that a coolant such as LN or LHe is passed through the interior of the cold head 76 or such that cooled He gas fed from a refigerator (not shown) is passed through the cold head. In the illustration, reference numeral 78 denotes a superconducting film pattern on the superconducting RV circuit board 74, 79 a coaxial conductor and 80a to 80d holes into which screws are inserted.

By thus providing the graphite sheet 73 and mounting the sheet 73 on the case 71 while pressing the sheet 73 by a pressing force of 10 N/cm² or greater, a thermally excellent state can be obtained without sacrificing the microwave characteristics.

Further, by adding on the sheet 73' in order to improve the thermal contact between the case 71 and the cooling end 76, the cooling performance can be improved further and a thermally excellent state can be obtained. In this case, the sheet 731 is given a structure in which it is provided with holes or partially cut away so as to avoid the screws.

(F) Fifth Embodiment

A fifth embodiment is a mounting structure for solving the problems of EMC, vibration of the internal circuits or and degradation of characteristics. Specifically, as shown in FIG. 19, an electrically conductive sheet (e.g. a graphite sheet) 91 having restorability and provided with holes at portions through which screws are passed is placed on peripheral top portions 71a to 71c of the box-shaped metal case 71, a cover 70 of the case 71 is placed thereon and the cover 70 and sheet 91 are fastened together by a plurality of screws 92.

Though the above-described sheet mounting method is easy, a problem which arises is that the sheet 91 shifts. Accordingly, a recess (groove) is formed in one of the case 71 or cover 70 (the top portions of the case in the illustration) and the sheet 91 is placed in the recess, whereby it can be mounted without shifting. At this time it is necessary to engineer contact between the cover 70 and case 71. In the case 71, a groove depth that is less than 80% of the thickness of the sheet 91 is appropriate. Further, the case 71 has the shape of a small box in order to avoid vibration and a break in the characteristic. The groove on the case side has its inner side cut away at the top portions 71a, 71b of the peripheral portions. The groove is cut into a U-shaped configuration at the top portion 71c, which is other than the peripheral portions. The cut-away portion serves as a guide and makes it possible to easily mount the sheet 91. Moreover, sealing is possible.

Further, it is possible to obtain the pressing force applied to the sheet 91 by pressing the sheet against the case 71 by a plurality of screws 92 (six in the illustration) via the cover 70. Since gaps are closed by adopting this expedient, radio waves will not leak from such gaps and external radio waves can be prevented from penetrating into the interior. As a result, the problems of EMC, vibration of internal circuitry and degradation of characteristics can be solved. That is, vibration in the internal circuitry is caused by part of the output being fed back to the input through the gap. Vibration does not occur because this cause is eliminated. Further, the degradation of characteristics also is caused by coupling between circuits through the gap. By eliminating the gaps, degradation of characteristics, e.g., a frequency characteristic having a break, does not occur.

Holes HL are provided in the portions of the sheet 91 through which screws are passed. Further, this example is one in which the case side is cut away. However, the effects are the same if the cover side is cut away.

Since the sheet 73, which has electrical conductivity equivalent to that of metal in terms of superconductivity and exhibits restorability, is in contact with the superconducting circuit board 74, the circuit board and case are grounded in excellent fashion and the characteristics are stabilized. Further, since thermal conductivity of the sheet 73 in the transverse direction is excellent, the superconductor is cooled uniformly and the characteristics are stabilized.

In accordance with the present invention, the rise in temperature of a packet is lowered from the conventional 35° C. to 12° C. in a case where the package houses a heat-producing body that gives off 80 W of heat, by way of example. As a result, in an example with a single amplifier stage, gain and output are improved by about 1.5 dB, efficiency is improved by about 7 to 8%, and distortion becomes an excellent 4 dB. Further, the invention is effective even at cryogenic temperatures used in superconductivity.

In accordance with the present invention, the sheet has electrical conductivity, unlike grease, and therefore it is possible to ground a microwave package or board. Further, application unevenness as occurs with grease need not be a cause of concern and mounting is easy.

In accordance with the present invention, the sheet has electrical conductivity, unlike grease, and therefore using the sheet at a shielded portion provides effects in relation also to EMC.

In accordance with the present invention, almost the same effects can be obtained regardless of whether the case surface is roughened or not. Since it suffices for surface roughening of the case to be of the lowest rank, a major reduction in cost can be expected. Further, experience is not required, unlike the case with gels that need to be applied thinly and evenly. Furthermore, a mounting structure that uses a sheet in accordance with the present invention has a wide temperature range and can be used in a temperature range from cryogenic temperatures, as are used in superconduction, to several hundred degrees centigrade.

Further, according to the present invention, a package and a circuit board can be grounded simultaneously via a sheet. Moreover, surface contact is obtained by joint fastening using screws, and degradation of microwave characteristics can be prevented. Further, even if there is a step at package- and circuit-board-bearing locations, severance of the sheet can be prevented by inclining the step.

Further, according to the present invention, malfunction due to release of radio waves and reception of radio waves, circuit vibration and a break in a characteristic are eliminated. There are also effects in regard to ECM.

What is claimed is:

1. An electronic device having a package internally incorporating at least one of a high-frequency transistor, a microwave integrated circuit (MIC), and a monolithic microwave integrated circuit (MMIC) used in a microwave to millimeter-wave band, a base thereof being formed of metal and serving as ground, and a case on which the package is mounted, comprising:

two circuit boards that are mounted at circuit-board-bearing locations on the case so that the two circuit boards sandwich, a package-bearing location on the case;

a package reception portion, formed at the package-bearing location, which receives the package and has a step on each of four sides, at least one step that is among the four steps and through which microwaves to millimeter-waves do not pass being inclined; and a graphite sheet that is laid on an entirety of the package reception portion and circuit-board-bearing locations, wherein the package and the graphite sheet are fastened together in the package reception portion and attached to the case by two or more screws.

* * * * *